(12) United States Patent
Lenchenkov et al.

(10) Patent No.: US 9,431,443 B1
(45) Date of Patent: Aug. 30, 2016

(54) IMAGE SENSOR WITH HEATING EFFECT AND RELATED METHODS

(71) Applicant: SEMICONDUCTOR COMPONENTS INDUSTRIES, LLC, Phoenix, AZ (US)

(72) Inventors: Victor Lenchenkov, Sunnyvale, CA (US); Hamid Soleimani, Cupertino, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/723,675

(22) Filed: May 28, 2015

(51) Int. Cl.
*H01L 27/146* (2006.01)

(52) U.S. Cl.
CPC ..... *H01L 27/14623* (2013.01); *H01L 27/1462* (2013.01); *H01L 27/1463* (2013.01); *H01L 27/1464* (2013.01); *H01L 27/14625* (2013.01); *H01L 27/14627* (2013.01); *H01L 27/14636* (2013.01); *H01L 27/14643* (2013.01)

(58) Field of Classification Search
CPC ............ H01L 27/14623; H01L 27/1463; H01L 27/1462; H01L 27/14636; H01L 27/14627; H01L 27/14643; H01L 27/1464; H01L 27/14625
See application file for complete search history.

(56) References Cited

U.S. PATENT DOCUMENTS

| | | | | |
|---|---|---|---|---|
| 2010/0060758 A1* | 3/2010 | Oshiyama | ......... | H01L 27/14683 348/294 |
| 2010/0148289 A1* | 6/2010 | McCarten | ........... | H01L 27/1463 257/432 |
| 2010/0258164 A1* | 10/2010 | Takeda | ................ | H01L 31/0352 136/252 |
| 2011/0227138 A1* | 9/2011 | Haddad | ............. | H01L 27/14609 257/291 |
| 2012/0313208 A1* | 12/2012 | Kim | ................... | H01L 27/14634 257/435 |
| 2013/0075607 A1* | 3/2013 | Bikumandla | ..... | H01L 27/14632 250/332 |
| 2013/0334640 A1* | 12/2013 | Lee | ................... | H01L 31/02325 257/432 |
| 2014/0159184 A1* | 6/2014 | Lim | .................. | H01L 27/14621 257/432 |
| 2014/0184810 A1* | 7/2014 | Sekiguchi | ........... | H01L 27/1461 348/164 |
| 2015/0340391 A1* | 11/2015 | Webster | ............ | H01L 27/14605 348/322 |
| 2016/0006965 A1* | 1/2016 | Lee | ..................... | H01L 27/1464 348/308 |
| 2016/0099266 A1* | 4/2016 | Zheng | ................. | H01L 27/1463 250/208.1 |

OTHER PUBLICATIONS

M. S. Chandrasekharaiah et al., The Disilicides of Tungsten, Molybdenum, Tatalum, Titanium, Cobalt, and Nickel, and Platinum Monosilicide: A Survey of Their Thermodynamic Properties, Dec. 21, 1992.

* cited by examiner

*Primary Examiner* — Evan Pert
*Assistant Examiner* — Farid Khan
(74) *Attorney, Agent, or Firm* — Adam R. Stephenson, LTD.

(57) ABSTRACT

An image sensor including a semiconductor layer. A light absorber layer couples with the semiconductor layer at a pixel of the image sensor and absorbs incident light to substantially prevent the incident light from entering the semiconductor layer. The light absorber layer heats a depletion region of the semiconductor layer in response to absorbing the incident light, creating electron/hole pairs. The light absorber layer may include one or more narrow bandgap materials.

14 Claims, 10 Drawing Sheets

IMAGE SENSOR WITH HEATING EFFECT AND RELATED METHODS

BACKGROUND

1. Technical Field

Aspects of this document relate generally to image sensors. More specific implementations involve complementary metal-oxide-semiconductor (CMOS) image sensors.

2. Background Art

Image sensors convey information related to an image by communicating signals in response to incident electromagnetic radiation. Image sensors are used in a variety of devices including smart phones, digital cameras, night vision devices, medical imagers, and many others. Semiconductor imagers utilizing charge-coupled device (CCD) and CMOS architectures exist in the art.

SUMMARY

Implementations of image sensors may include: a semiconductor layer, and; a light absorber layer coupled with the semiconductor layer at a pixel of the image sensor, the light absorber layer configured to absorb incident light and to substantially prevent the incident light from entering the semiconductor layer; wherein the light absorber layer is configured to heat a region (heated region) of the semiconductor layer in response to absorbing the incident light and to create electron/hole pairs in the heated region thereby.

Implementations of image sensors may include one, all, or any of the following:

The light absorber layer may include a material selected from the group consisting of: Co; $CoSi_2$; Mo; $MoSi_2$; Ni; NiSi; $Ni_2Si$; $NiSi_2$; Pd; PdSi; $Pd_2Si$; Pt; PtSi; Ta; $TaSi_2$; Ti; $TiSi_2$; W; WSi; $WSi_2$; Zr; $ZrSi_2$; polycrystalline Si; Ge doped monocrystalline Si; Ge film on Ge doped silicon; GeSe film on Silicon; and any combination thereof.

A microlens may be included, the light absorber layer coupled between the microlens and the semiconductor layer, the microlens configured to refract the incident IR light towards the light absorber layer.

A guide may be coupled between the microlens and the light absorber layer and may be configured to convey the refracted light to the light absorber layer.

The image sensor may be a backside integrated (BSI) sensor.

The light absorber layer may be positioned between two shallow trenches in the semiconductor layer, each shallow trench extending only partially through the semiconductor layer from a backside of the semiconductor layer towards a frontside of the semiconductor layer.

The light absorber layer may be positioned between two deep trenches of the semiconductor layer, each deep trench extending fully through the semiconductor layer from a backside of the semiconductor layer through to a frontside of the semiconductor layer.

An antireflective coating (ARC) may be coupled between the incident light and the light absorber layer.

The image sensor may have a quantum efficiency (QE) above 50% for photons within a wavelength range of 0.7 to 20 microns.

Implementations of image sensors may include: a photodiode included at least partially within a semiconductor layer, and; a light absorber layer coupled with the photodiode, the light absorber layer configured to absorb incident light within predetermined wavelengths to substantially prevent the incident light from passing from the light absorber layer to the photodiode; wherein the light absorber layer is configured to heat a depletion region of the photodiode in response to absorbing the incident light and to create electron/hole pairs in the depletion region thereby, and; wherein the image sensor further includes at least one dielectric layer coupled with the semiconductor layer, and electrical routing coupled at least partially within the at least one dielectric layer which electrically couples the photodiode with at least one other element of the image sensor.

Implementations of image sensors may include one, all, or any of the following:

An antireflective coating (ARC) may be coupled between the incident light and the light absorber layer.

The light absorber layer may be located at a backside of the semiconductor layer and the at least one dielectric layer may include a frontside dielectric layer coupled at a frontside of the semiconductor layer opposite the backside of the semiconductor layer.

The light absorber layer may be located at a backside of the semiconductor layer, a focusing element may be located proximate a frontside of the semiconductor layer opposite the backside of the semiconductor layer, and the focusing element may be configured to focus the incident light, that has already passed through the semiconductor layer, back through the semiconductor layer towards the backside of the semiconductor layer.

The light absorber layer may be located at a backside of the semiconductor layer, the at least one dielectric layer may include a frontside dielectric layer and a backside dielectric layer, the backside dielectric layer may be located at the backside of the semiconductor layer, a focusing element may be located proximate the backside dielectric layer and may be configured to focus the incident light through the backside dielectric layer towards the light absorber layer, the frontside dielectric layer may be located at a frontside of the semiconductor layer opposite the backside of the semiconductor layer, and the electrical routing of the image sensor may be included at least partially within the frontside dielectric layer.

The light absorber layer may be located at a frontside of the semiconductor layer, the at least one dielectric layer may include a frontside dielectric layer coupled at the frontside of the semiconductor layer, a focusing element may be located proximate the frontside dielectric layer and may be configured to focus the incident light through the frontside dielectric layer towards the light absorber layer, and the electrical routing of the image sensor may be included at least partially within the frontside dielectric layer.

The light absorber layer may include a material selected from the group consisting of: Co; $CoSi_2$; Mo; $MoSi_2$; Ni; NiSi; $Ni_2Si$; $NiSi_2$; Pd; PdSi; $Pd_2Si$; Pt; PtSi; Ta; $TaSi_2$; Ti; $TiSi_2$; W; WSi; $WSi_2$; Zr; $ZrSi_2$; polycrystalline Si; Ge doped monocrystalline Si; Ge film on Ge doped silicon; GeSe film on Silicon; and any combination thereof.

The light absorber layer may be positioned between two trenches in the semiconductor layer, each trench extending at least partially through the semiconductor layer.

The image sensor may have a quantum efficiency (QE) above 50% for photons within a wavelength range of 0.7 to 20 microns.

Implementations of image sensors may include: a complementary metal-oxide-semiconductor (CMOS) device having a semiconductor layer, the semiconductor layer including a plurality of photodiodes, each photodiode having a pixel having a depletion region, and; a plurality of light absorber layers, each light absorber layer coupled with one of the pixels of the semiconductor layer, each light absorber layer configured to absorb incident light and substantially prevent the incident light from entering one of the photodiodes; wherein each light absorber layer is configured to heat the depletion region of one of the photodiodes in response to absorbing the incident light, and to create electron/hole pairs in the depletion region thereby, through an increase in temperature alone.

Implementations of image sensors may include one, all, or any of the following:

The image sensor may have a quantum efficiency (QE) above 50% for photons within a wavelength range of 0.7 to 20 microns.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensors and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensors and related methods, and implementing components and methods, consistent with the intended operation and methods.

As used herein, the term "image sensor" may refer both to a sensor associated with only an individual pixel as well as to a sensor associated with a plurality (such as an array) of pixels. As used herein, the term "backside" refers to a side (in other words a surface) of an element corresponding with (in other words, located at, or facing) a wafer backside during fabrication. As used herein, the term "frontside" refers to a side (in other words, a surface) of an element corresponding with (in other words, located at, or facing) a wafer frontside during fabrication.

Figure 1:
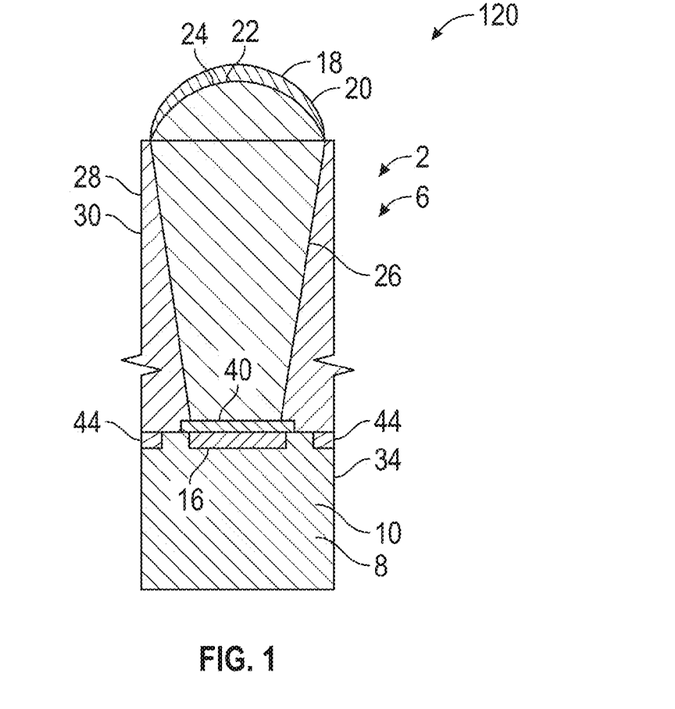
FIG. 1 is a cross section view of an implementation of an image sensor.
Figure 2:
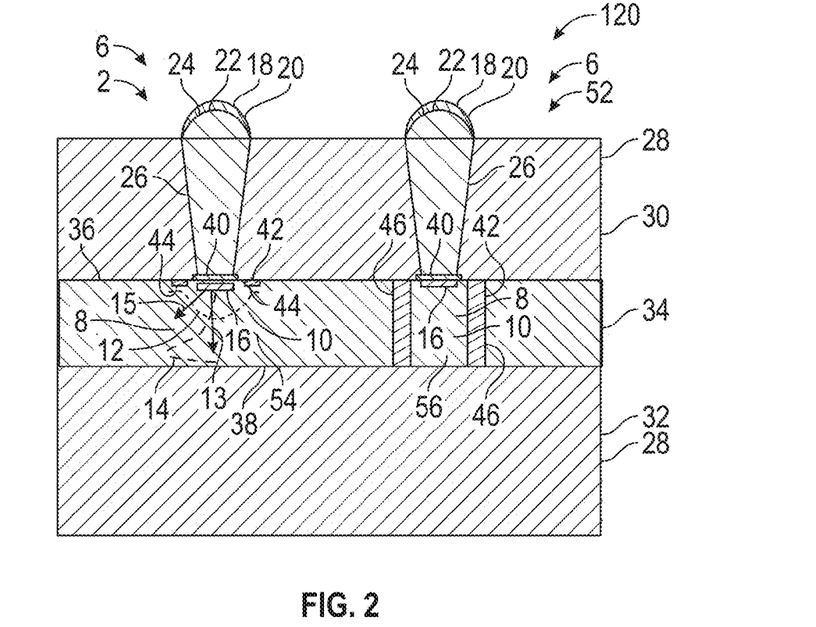
FIG. 2 is a cross section view of the image sensor of FIG. 1 and another implementation of an image sensor.

Referring now to FIGS. 1-2, in various implementations an image sensor (sensor) 2 is formed as a backside integrated (BSI) sensor 6 or, in other words, it is formed adjacent a wafer backside during fabrication. Image sensor 2 includes a photodiode 8 associated with a single pixel 10. Trenches 42 are used for isolation purposes—in this case primarily for heat isolation, as is discussed herein. Shallow trenches 44 are used with the leftmost image sensor 2 shown in FIG. 2 and deep trenches 46 are shown with the rightmost image sensor 52 shown in FIG. 2.

In FIGS. 1-2 a semiconductor layer 34 is sandwiched between two dielectric layers 28. The dielectric layers may be intermetal dielectric (IMD) or interlayer dielectric layers (ILD). The semiconductor layer in this representative example is a silicon layer and the dielectric layers are silicon dioxide ($SiO_2$) layers. The trenches in the examples shown in the drawings are formed with SiO$_2$ as well. One of the dielectric layers is a frontside dielectric layer 32 which corresponds with (or in other words is located at) a wafer frontside during fabrication. The other dielectric layer is a backside dielectric layer 30 which corresponds with (or in other words is located at) a wafer backside during fabrication. The semiconductor layer thus has a backside surface 36 which faces (or is located at or on) the wafer backside and a frontside surface 38 which faces (or is located at or on) the wafer frontside during fabrication. The frontside dielectric layer is coupled with the frontside surface of the semiconductor layer and the backside dielectric layer is coupled with the backside surface of the semiconductor layer.

Although silicon-based semiconductor layers and dielectric layers are used in the representative examples, in other implementations non-silicon-based semiconductor layers and/or dielectric layers could be used as well. The elements of image sensors disclosed herein, however, may be useful to allow the formation of infrared (IR) sensors using silicon-based semiconductor layers, which layers in and of themselves are generally incapable of IR sensing due to the bandgap properties of silicon. However, various image sensor implementations may be utilized to detect visible and human invisible light (i.e., ultraviolet, etc.) and any combination of visible and human invisible light.

In FIG. 2 there are two pixels 10 shown, a first pixel 54 and a second pixel 56. Such pixels may naturally be arranged in a line, in an array, or in any other arrangement in order to achieve an image sensor having a plurality of pixels arranged according to any desired configuration.

Each photodiode/pixel is associated with, or includes, a photodiode depletion region 14. The photodiode depletion region 14 is generally located in a plane perpendicular with the page and is represented by the dashed line shown, having a maximum voltage (such as a pin voltage of a semiconductor device including the image sensor(s), or $V_{PIN}$) at the frontside surface 38. A photodiode depletion potential 12, represented in the plane of the page by the other dashed line shown, with a barrier shown at approximately the p-well region, is associated with each pixel. When an event occurs sufficient to create electron/hole pairs, an electron flow 13 and a hole flow 15 are produced, and are representatively depicted by the arrows shown, thus providing a current to produce a signal associated with the pixel, as separated electrons are collected by the photodiode depletion field of the pixel.

A lens 22 and/or a light guide 26 may be included to refract, focus and/or otherwise convey light towards the pixel. Lens 22 in implementations is a silicon nitride (SiN) microlens 24. In other implementations, the light guide 26/lens 22 may each be made of, by non-limiting example, Si, TiO2, SiC or any other high index and non-light absorbing material that has a low thermal conductivity relative to materials such as metals. The light guide 26 is generally housed or situated within the backside dielectric layer 30. An antireflective coating (ARC) 40 is included which reduces the percentage of light that is reflected back out of the light guide away from the pixel. An antireflective coating (ARC) 18 is also placed atop the lens 22 to reduce the amount of light that is reflected back upwards at the lens surface. In implementations ARC 40 is formed of silicon dioxide (SiO$_2$). In other implementations ARC 40 could be formed of SiN, SiC, TiO$_2$, polycrystalline Si (poly-Si), amorphous Si (a-Si), or another material. In implementations the lens may be formed as a bump and the ARC 18 may be formed as a coating on the bump. In implementations in which the lens is a bump it may be formed of the same material as the light guide and both could be formed of one continuous element with no surfaces therebetween.

The elements described thus far may be used to sense light within given wavelengths. When the wavelength of light entering the lens/light guide is configured to create electron/hole pairs in the semiconductor layer due to the characteristic band gap of the semiconductor material, a current will be produced and the light will be sensed, or, in other words, the light may be used to create a signal representative of the light. Some wavelengths of light may be unable to produce a signal based on the band gap of the semiconductor material. For example, some or all infrared (IR) wavelengths generally will pass through a semiconductor layer made of silicon without producing such a signal due to the specific band gap of silicon.

In implementations of an image sensor 2/52, a light absorber layer 16 is placed at the backside surface 36 and corresponds with the bottom of the light guide. In the example shown in FIGS. 1-2 the light absorber layer has the ARC 40 placed atop it. The light absorber layer is configured to absorb light of a predetermined wavelength. In the representative examples shown in the drawings, the light absorber layer is specifically tailored to absorb light in the infrared (IR) region, though in other implementations it could be tailored to absorb light in any other spectral regions of light, whether human visible or not. The light absorber layer is formed of a material that is configured to absorb photon energy of incident light and convert the photon energy into heat. The generated heat then creates/facilitates creating electron/hole pairs to provide the current that is used to provide a signal and therefore sense the light. This process by which the light absorber layer absorbs light and generates heat to the pixel structure beneath it can be referred to as photo-thermally coupling the light absorber layer with the pixel.

In implementations the light absorber layer includes an electrically conductive material (conductor). In implementations the light absorber layer includes one or more of the following materials: Co; CoSi$_2$; Mo; MoSi$_2$; Ni; NiSi; Ni$_2$Si; NiSi$_2$; Pd; PdSi; Pd$_2$Si; Pt; PtSi; Ta; TaSi$_2$; Ti; TiSi$_2$; W; WSi; WSi$_2$; Zr; ZrSi$_2$; polycrystalline Si; Ge doped monocrystalline Si; Ge film on Ge doped silicon; GeSe film on Silicon; and/or any combination thereof. Many other materials may be used for sensing IR light so long as they have high absorption for lower frequencies of light. In implementations in which the light absorber layer is a metal silicide and the semiconductor layer is a silicon-based semiconductor (such as monocrystalline or polycrystalline silicon), the metal silicide may act as a perfect or near perfect electronic-vibrational heat transfer bridge between the metal and the silicon, and may ensure a fast (or the fastest) local heat transfer rate into the pixel. In various implementations, the light absorber layer may be referred to as including one or more narrow band semiconductors or conductors which act as highly efficient absorbers of incident radiation and converters of the absorbed energy to heat localized beneath the layer. The semiconductor layer may be referred to as a broad band semiconductor that contains a pixel depletion region. This pixel depletion region is a region with a built-in depletion field configured to separate electron-hole pairs formed inside or at the boundary of the depletion region of a given pixel at the location of the interface of the light absorber layer and the semiconductor layer. The heat generated by the light absorber layer, as discussed herein, generates electron-hole pairs in the pixel depletion region.

Figure 5:
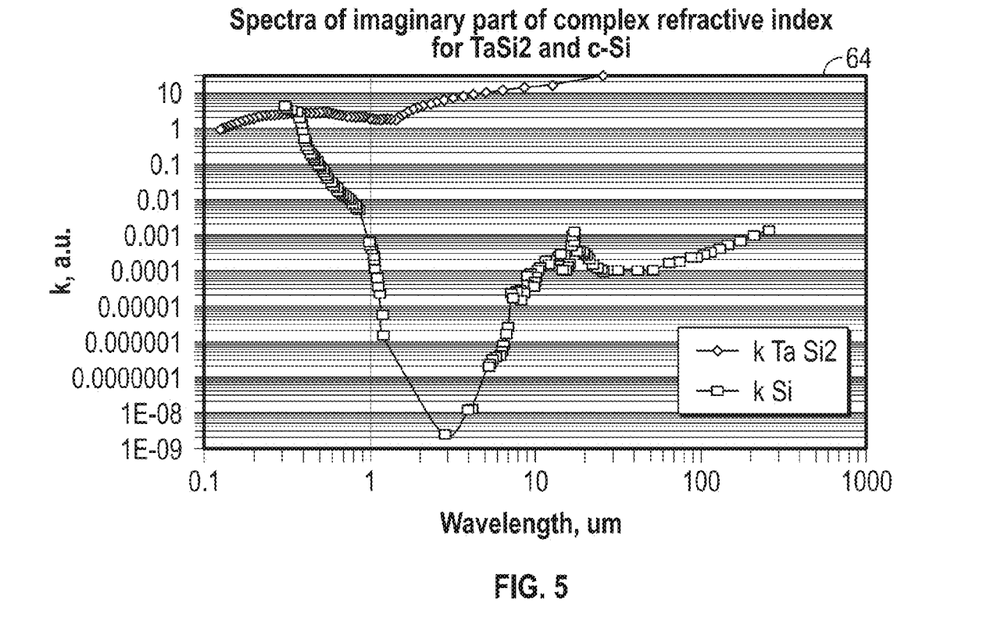
FIG. 5 is a graph plotting spectra of an imaginary part of complex refractive index for $TaSi_2$ and c-Si as a function of wavelength.

A material's ability to function well as material for a light absorber layer may be predictable using the imaginary part of the complex index of refraction—a higher "k" value corresponds to higher absorption values. For example, FIG. 5 shows a graph 64 which plots exponential k values for TaSi$_2$ and monocrystalline Si (c-Si) against spectral wavelength. A formula for determining absorption is: Absorption=1−exp(−4πkd/λ); where d=thickness, λ=wavelength and k=the imaginary part of the refractive index.

Figure 6:
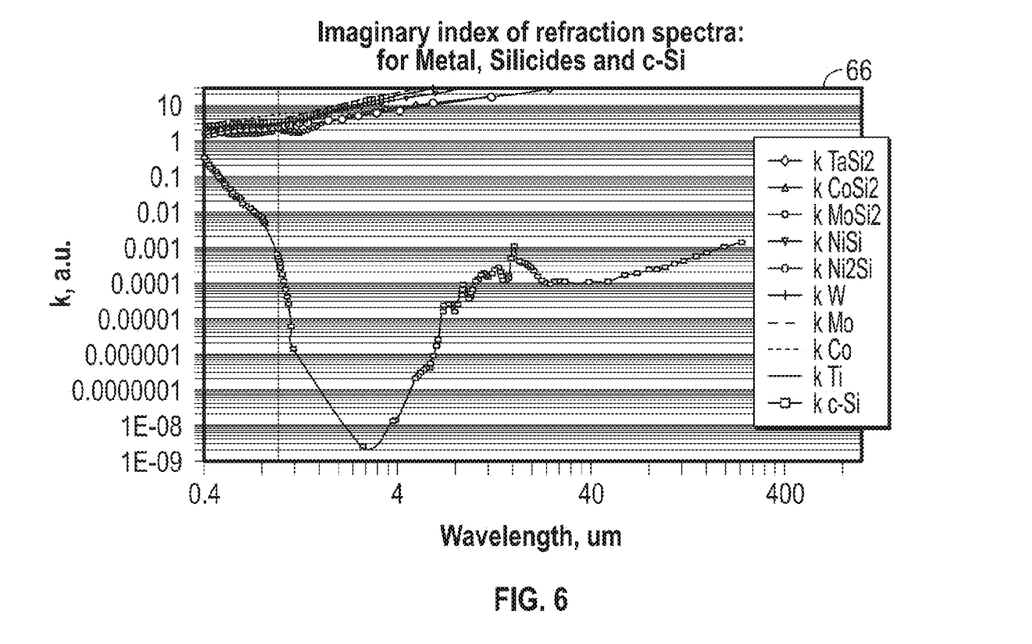
FIG. 6 is a graph plotting imaginary index of refraction spectra for a plurality of materials as a function of wavelength.

From FIG. 5 it can be seen that 100% absorption in very thin TaSi$_2$ happens in a very wide spectral range, about 10 to 100 times wider than in monocrystalline silicon. This predicts that an image sensor for wide range IR sensing may be formed with one or more wide range IR sensitive pixels using a thin TaSi$_2$ layer as the light absorber layer. This may be formed as a BSI sensor. FIG. 6 shows a graph 66 which plots exponential k values for a few metals, metal silicides (namely, TaSi$_2$, CoSi$_2$, MoSi$_2$, NiSi, Ni$_2$Si, W, Mo, Co, and Ti), and monocrystalline Si (c-Si) against light wavelength. Each metal and silicide plotted exhibits an exponential absorption coefficient at least about 100-1,000 times higher than that in monocrystalline Si and would allow the detection of photons in a much wider spectral range—at least 100 times greater—than monocrystalline Si. The differences in absorption coefficient shows significant predominance in conductor density of states (DOS) at the low frequency portion of the spectra responsible for fast, efficient heat transfer—thus equating to a very fast, localized heating effect in a pixel. The k value is directly related to DOS and is often used in spectroscopy to estimate DOS.

Thus, the light absorber layer in implementations may include a highly absorptive, non-reflective (or low-reflective) thin layer conductor at the back side integrated (BSI) side of a complementary metal-oxide-semiconductor (CMOS) or CCD image sensor pixel to generate a fast localized heating effect of the semiconductor material (such as Si) for greater electron/hole generation in the pixel/photodiode depletion region. Spreading the light absorber layer laterally above, near or within the pixel photodiode depletion region (and/or centering the light absorber layer relative to the pixel) localizes heat for increased electron/hole pair generation at or near the interface of the light absorber layer with the semiconductor layer. Generated electron/hole pairs are separated and signal electrons are collected using the photodiode depletion field 12.

Figure 18:
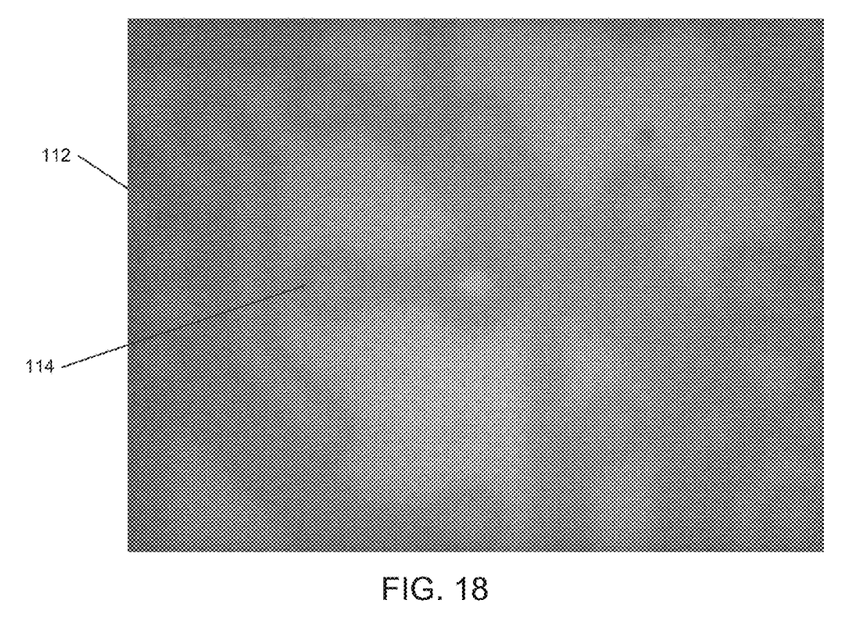
FIG. 18 is a top view of a dark signal (dark current) image of a printed circuit board (PCB) generated using a traditional image sensor without a light absorber layer.
Figure 19:
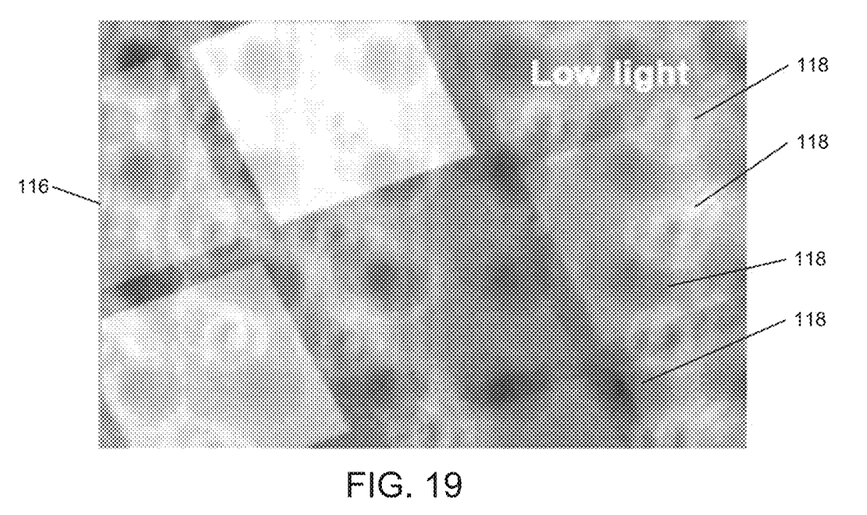
FIG. 19 is a top view of another dark signal (dark current) image of a printed circuit board (PCB) generated using a traditional image sensor without a light absorber layer.
Figure 20:
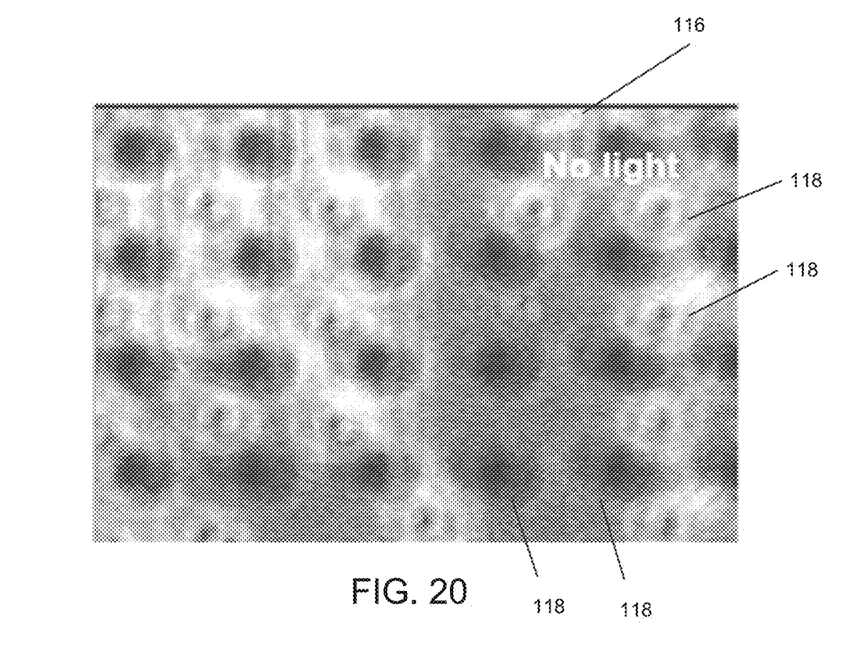
FIG. 20 is a top view of another dark signal (dark current) image of a printed circuit board (PCB) generated using a traditional image sensor without a light absorber layer.

Energy from the absorbed photons is very quickly converted into non-equilibrated pixel-localized heat. This absorption/conversion may likely occur within a few picoseconds which is much faster than lateral heat dissipation in Si via phonons (approximately 10-15 THz). FIGS. 18-20 show experimental observations in which even slower resistive heating rates on the order of GHz generate laterally well-defined signals (as "dark current" or "dark signal" images) from printed circuit boards of traditional image sensor pixel arrays. Thus "dark current" or "dark signal" which is exhibited in traditional image sensors is unintentionally captured, but with the image sensors 2, 52 disclosed herein, such dark current will be captured intentionally by absorption of lower than Si bandgap photons in a light absorber layer. Accordingly, the image sensors utilizing light absorber layers allow the imaging of long wavelengths of light even when these are outside of the Si bandgap. Upon absorption of IR photons with frequencies of about 30-500 THz (wavelengths of 10-0.6 micrometers) the increased local heating in the pixel will resulting in increased electron-hole pair generation compared with the aforementioned process related to traditional image sensors.

FIG. 18 shows a printed circuit board (PCB) 112 of a traditional image sensor, the PCB having metal routing 114 giving off a "dark signal" from resistive heating that is captured by the image sensor. FIGS. 19-10 show a printed circuit board (PCB) 116 of another traditional image sensor with contact balls 118 formed of tungsten, the contact balls giving off a "dark signal" as captured by the traditional image sensor. As indicated on the images, FIG. 19 is a low light capture (i.e., low irradiation of the image sensor) and FIG. 20 is a no light capture (i.e., no irradiation of the image sensor). In each of these cases the dark signal is generated due to resistive heating of the elements of the image sensor (or the PCB of the image sensor or a PCB coupled with the image sensor). Thus, resistive heating of the metal routing in FIG. 18 and resistive heating of the contact balls in FIGS. 19-20 creates the dark signals shown in the images. FIG. 18 was captured with a front side illuminated sensor. FIGS. 19-20 were obtained at 70 degrees Celsius and reveal a non-uniformity among the contact balls. Such dark signals have also been captured in BSI image sensor arrays from resistively heated TiN plugs.

In the above cases of FIGS. 18-20 the dark signal is produced by a resistively heated conductor at the conductor/semiconductor (i.e., conductor/Si) interface. In these cases wavelengths longer than the maximum wavelength for monocrystalline silicon (which is approximately 1.2 microns), are detected as dark signals. FIG. 18 is a traditional front side image sensor producing a dark signal either though resistive heating of the PCB routings or through long wavelength absorption. In implementations the image sensors 2, 52 and others disclosed herein could be configured to detect dark signals of a PCB or other element coupled with the image sensor that create a "constant" dark image (noise) during use and to automatically correct for them.

In the image sensors 2, 52 and others disclosed herein, the light absorber layer placed at the BSI side of the semiconductor layer (such as Si) in a BSI CMOS image sensor pixel enhances and extends the sensing capability of a light sensor beyond the Si band gap to long light wavelengths in the spectral range of about 0.7 to 20 microns.

In the implementations shown in FIGS. 1-2 the image sensors 2/52 are complementary metal-oxide-semiconductor (CMOS) sensors 120, though other types of devices could be used to form the image sensors 2/52 such as charge-coupled device (CCD) sensors. When a CMOS sensor 120 is used, the device is becomes an enhanced IR sensitive BSI CMOS image sensor which uses a local photon heating effect.

Figure 3:
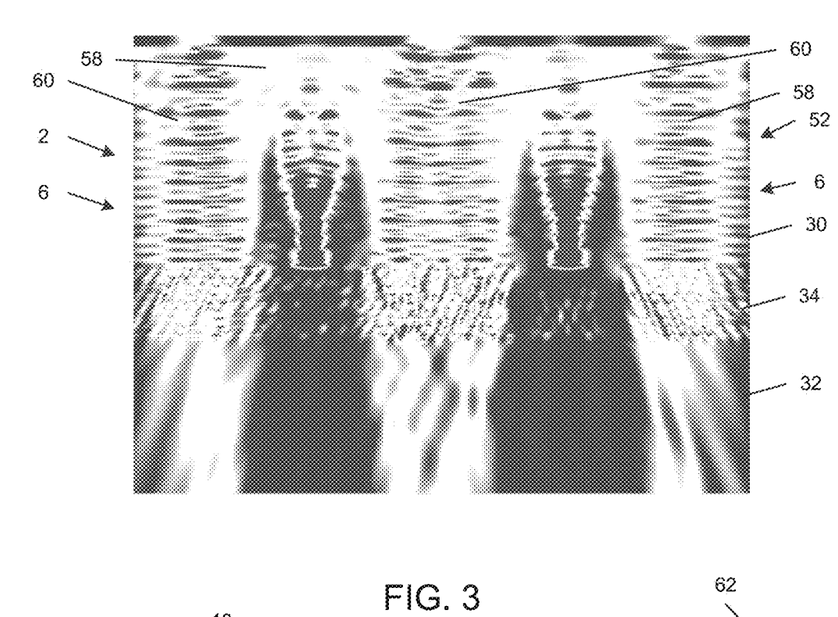
FIG. 3 is a cross section view of the image sensors of FIG. 2 with incident and refracted infrared (IR) light waves representatively illustrated.

FIG. 3 is an image produced using a nanophotonic modeling software sold under the trade name FDTD SOLUTIONS by Lumerical Solutions, Inc. of Vancouver, Canada. Variables used in the model were optimized to achieve above 60% theoretical quantum efficiency (QE) and include, among others, the following parameters (which may also be used in actual implementations of image sensors): the image sensor is a BSI sensor; the incident light is a 1500 nanometer (nm) wavelength plane wave of light; lens 22 has a radius of curvature of 1860 nm and a height of 640 nm and is made of SiN; ARC 18 is an SiO$_2$ ARC 20 and is 200 nm thick; the semiconductor layer 34 is 2 micron thick silicon; the pixel width/diameter is 3 microns; the light absorber layer is a 160 nm thick TaSi$_2$ layer; the light guide is formed of SiN having an entrance diameter D$_{IN}$ of 1500 nm, an exit diameter D$_{OUT}$ of 260 nm and a length from D$_{IN}$ to D$_{OUT}$ of 3280 nm; the area/volume above the backside dielectric layer is air; the ARC 40 is a 110 nm by 1800 nm SiC layer (n=2.6; k=0); the backside dielectric layer is, or is about, 3-4 microns thick and is formed of SiO$_2$; the frontside dielectric layer is, or is about, 4 microns thick and is formed of SiO$_2$, and; the shallow and deep trenches are formed of SiO$_2$.

Not all of the elements of FIG. 2 are specifically pointed out in FIG. 3, but the reader can envision where the various elements would be located if the two images were superimposed. The backside dielectric layer 30, semiconductor layer 34 and frontside dielectric layer 32 are indicated, and the position of the image sensors 2 and 52 are generally pointed to and their locations are evident from the light profile and from the previous FIG. 2 which has the same configuration for the various elements. As can be seen from the image in FIG. 3 produced by the modeling software, the incident light 58, which in this case is infrared (IR) light 60, is irradiated towards two image sensors, an image sensor 2 and an image sensor 52, both of which are backside image sensors 6, but image sensor 2 has the shallow trench configuration while image sensor 52 has the deep trench configuration as discussed herein. The model shows a high intensity of the incident 1500 nm wavelength light before it hits the SiC/TaSi$_2$ interface.

The optical simulation shows intensity distribution of the 1500 nm light. With respect to the lefthand image sensor 2, none of the 1500 nm light is passing through the TaSi$_2$ layer, and this results in a pixel quantum efficiency (QE) of 62%, assuming that 100% of absorbed photon energy is converted into un-equilibrated heat within the TaSi$_2$ light absorber layer 16. The model also shows little or zero absorption of 1500 nm light in the silicon semiconductor layer, as the light intensity appears unchanged in the regions where the infrared light passes into and through the silicon layer. The right hand image sensor 52 appears to show similar properties. The two image sensors 2 and 52 appear to behave generally identically notwithstanding the deep trench configuration of image sensor 52 and the shallow trench configuration of image sensor 2. The region through which the 1500 nm light is blocked may be marginally or negligibly larger for the image sensor 52 but, in general, isolation choice does not appear to impact optical characteristics at 1500 nm.

The models above indicate that image sensors including the elements described herein may achieve a very high sensitivity (above 50% quantum efficiency (QE)) of infrared photons in a very wide spectral range including 0.7 to 20 micron wavelengths (beyond the Si band gap).

Figure 4:
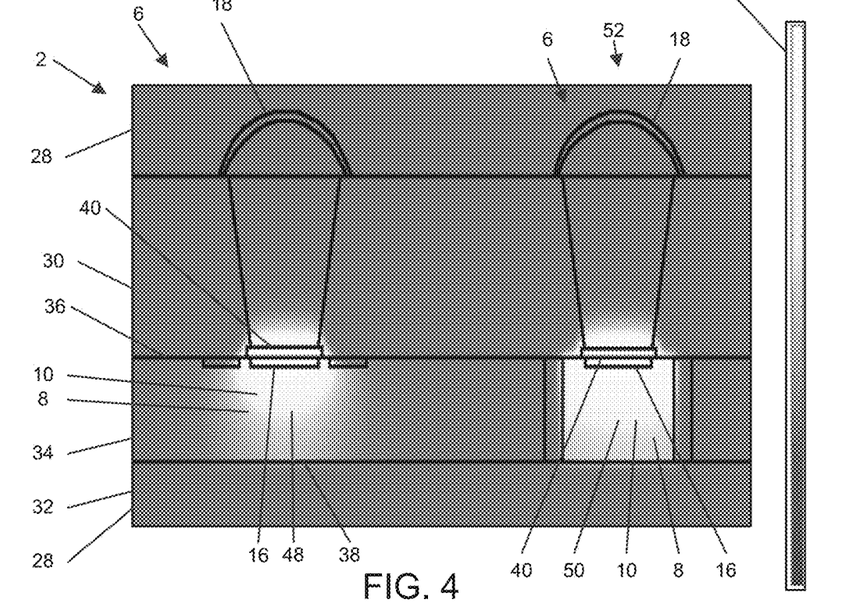
FIG. 4 is a cross section view of the image sensors of FIG. 3 with temperature profiles of the image sensors representatively illustrated.

FIG. 4 shows an image created with a modeling software sold under the trade name COMSOL MULTIPHYSICS by COMSOL, Inc. of Burlington, Mass. and using the same parameters as those described above with respect to the FDTD SOLUTIONS model. The image shows temperature distribution 20 nanoseconds after absorption of an incident 1500 nm light wave by the light absorber layer. A heat scale 62 is shown and ranges from 24 degrees Celsius (dark end) to 40 degrees Celsius (light end), and corresponding colors in FIG. 3 therefore illustrate the temperature distribution. As can be seen, lateral heat dissipation is relatively slow. The heat is fairly localized at 20 ns for both the light sensor on the left with shallow trench isolation (shown by heated region 48) and the light sensor on the right with deep trench isolation (shown by heated region 50). The heat is generally confined to the pixel area in both cases. The light sensor with deep trench isolation on the right, however, shows a substantially improved confinement of the heat to within the pixel active area, thus increasing its temperature higher and improving its quantum efficiency (QE). This model assumes that 100% of the absorbed 1500 nm photon energy is converted into non-equilibrated localized heat within the pixel. Pixel quantum efficiency (QE) at 1500 nm according to the model is 62%.

FIGS. 11A-17B show modeled time lapse images showing absorption, reflection, refraction, and pass-through of a pulse of 1500 nm light using the same variables as discussed above. FIGS. 11A, 12A, 13A, 14A, 15A, 16A, and 17A show versions where the left hand image sensor 4 does not include a light absorber layer and includes shallow trench isolation, while the right hand image does include a light absorber layer and includes deep trench isolation. In FIGS. 11B, 12B, 13B, 14B, 15B, 16B and 17B, the variables are exactly similar except that the lefthand image sensor does include a light absorber layer.

Figure 11A:
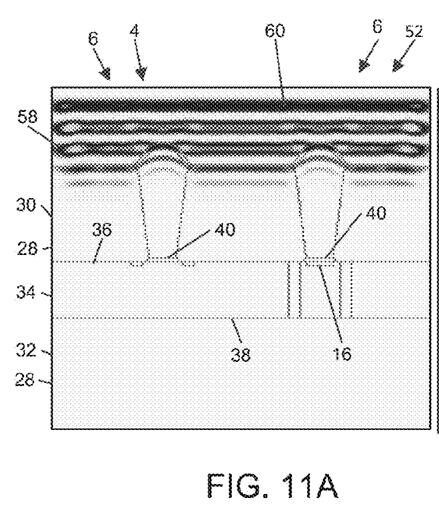
FIG. 11A is a cross section view of an image sensor without a light absorbing layer (between two shallow trenches on the left) next to an image sensor with a light absorbing layer (between two deep trenches on the right), illustrating incident and refracted light.
Figure 11B:
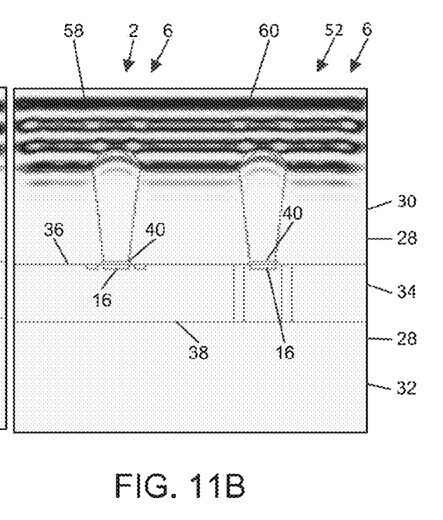
FIG. 11B is a cross section view of an image sensor with a light absorbing layer (between two shallow trenches on the left) next to an image sensor with a light absorbing layer (between two deep trenches on the right), illustrating incident and refracted light.
Figure 12A:
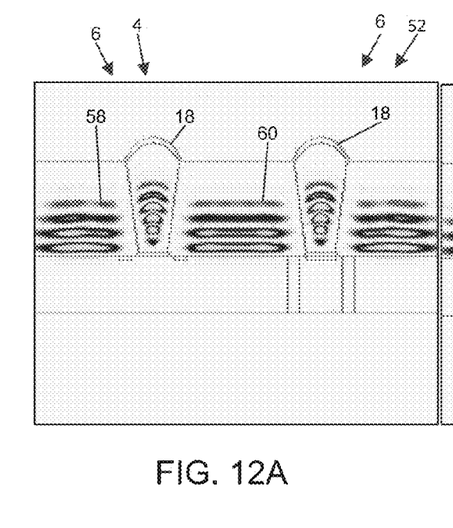
FIG. 12A is a cross section view of the image sensors of FIG. 11A after a specified amount of time has lapsed.
Figure 12B:
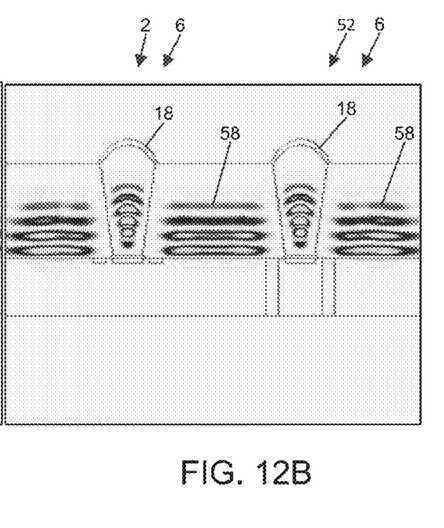
FIG. 12B is a cross section view of the image sensors of FIG. 11B after a specified amount of time has lapsed.
Figure 13A:
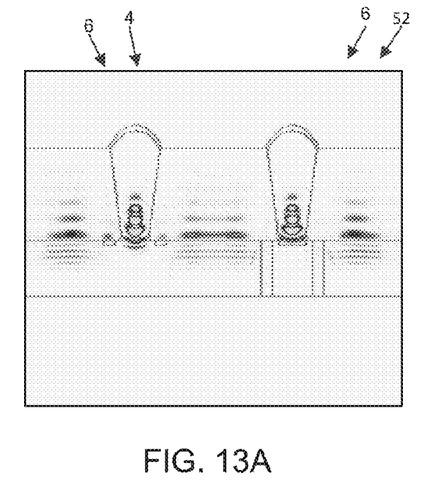
FIG. 13A is a cross section view of the image sensors of FIG. 12A after a specified amount of time has lapsed.
Figure 13B:
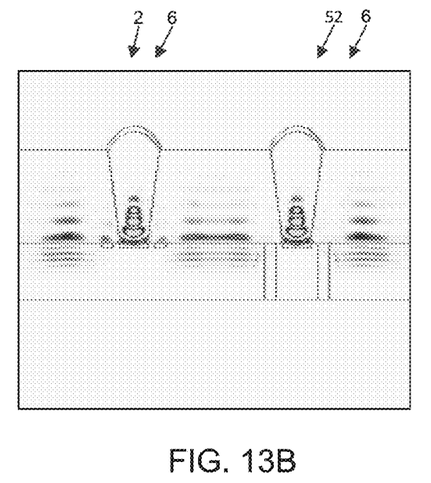
FIG. 13B is a cross section view of the image sensors of FIG. 12B after a specified amount of time has lapsed.
Figure 14A:
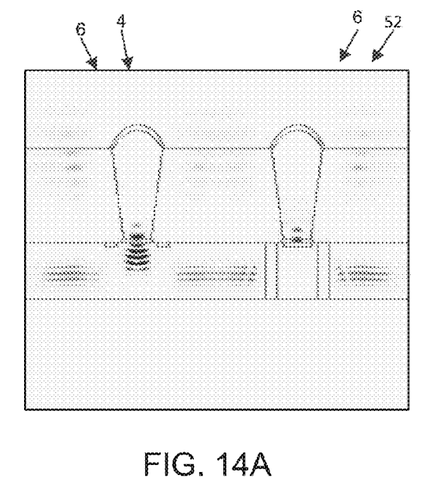
FIG. 14A is a cross section view of the image sensors of FIG. 13A after a specified amount of time has lapsed.
Figure 14B:
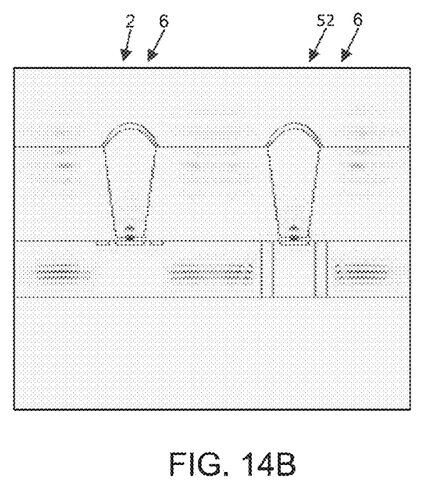
FIG. 14B is a cross section view of the image sensors of FIG. 13B after a specified amount of time has lapsed.
Figure 15A:
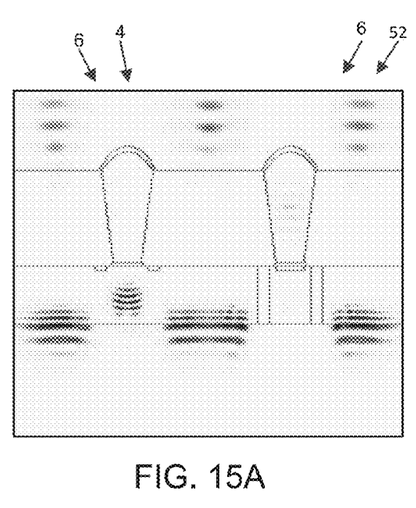
FIG. 15A is a cross section view of the image sensors of FIG. 14A after a specified amount of time has lapsed.
Figure 15B:
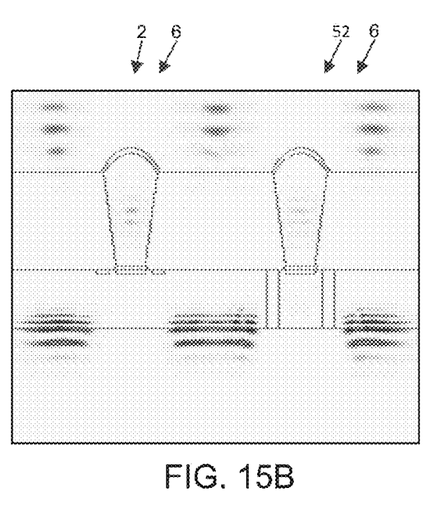
FIG. 15B is a cross section view of the image sensors of FIG. 14B after a specified amount of time has lapsed.
Figure 16A:
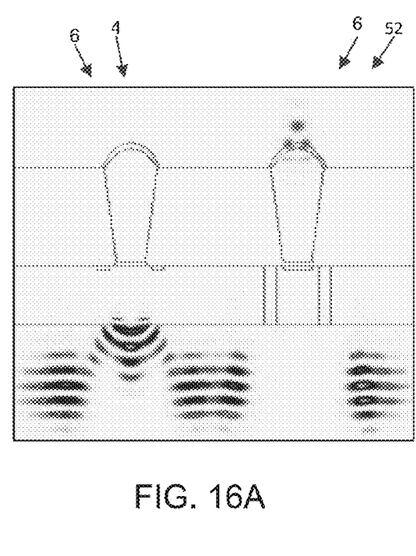
FIG. 16A is a cross section view of the image sensors of FIG. 15A after a specified amount of time has lapsed.
Figure 16B:
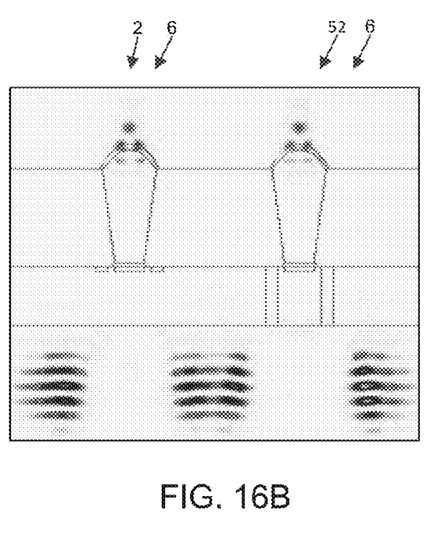
FIG. 16B is a cross section view of the image sensors of FIG. 15B after a specified amount of time has lapsed.
Figure 17A:
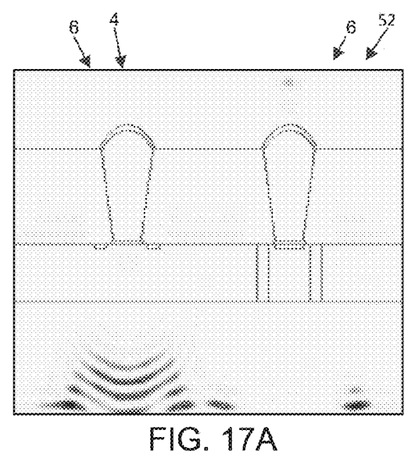
FIG. 17A is a cross section view of the image sensors of FIG. 16A after a specified amount of time has lapsed.
Figure 17B:
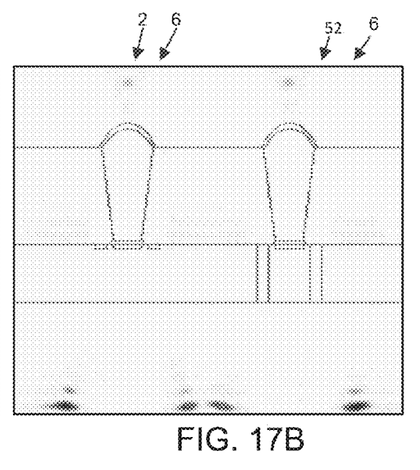
FIG. 17B is a cross section view of the image sensors of FIG. 16B after a specified amount of time has lapsed.

In FIGS. 11A and 11B the incident light 58, which in this model is infrared (IR) light 60 of 1500 nm, has begun to pass through the backside dielectric layer on the sides of the light guides and to be refracted (focused) by the lenses and light guides. In FIGS. 12A and 12B the passing of the light through the backside dielectric layer is further seen as well as further refraction/focusing by the light guides. In FIGS. 13A and 13B the light on the sides of the light guides is seen partially passing through the semiconductor layer and partially being reflected, while the light within the light guides in every case is seen as being further refracted/focused and being fully absorbed by the light absorber layers—except with regards to image sensor 4 wherein the light is seen passing straight through the light guide into the semiconductor layer. This generally continues with the remaining FIGS. 14A-17B—the light is shown to pass straight through image sensor 4 and into the semiconductor layer, through the semiconductor layer to the frontside dielectric layer, and so forth. There is some refraction seen at each layer.

Thus, the modeled images of FIGS. 11A-17B show generally what would be expected in light of the continuous irradiation model of FIG. 3, namely, none of the incident 1500 nm light pulse passes through the light absorption layers, but the image sensor 4 without a light absorber layer allows the light to pass straight through it and out into the semiconductor layer, and out of the semiconductor layer into the frontside dielectric layer. Image sensor 4 accordingly does not "sense" the infrared light pulse, as is the case with traditional silicon-based image sensors in general.

Figure 7:
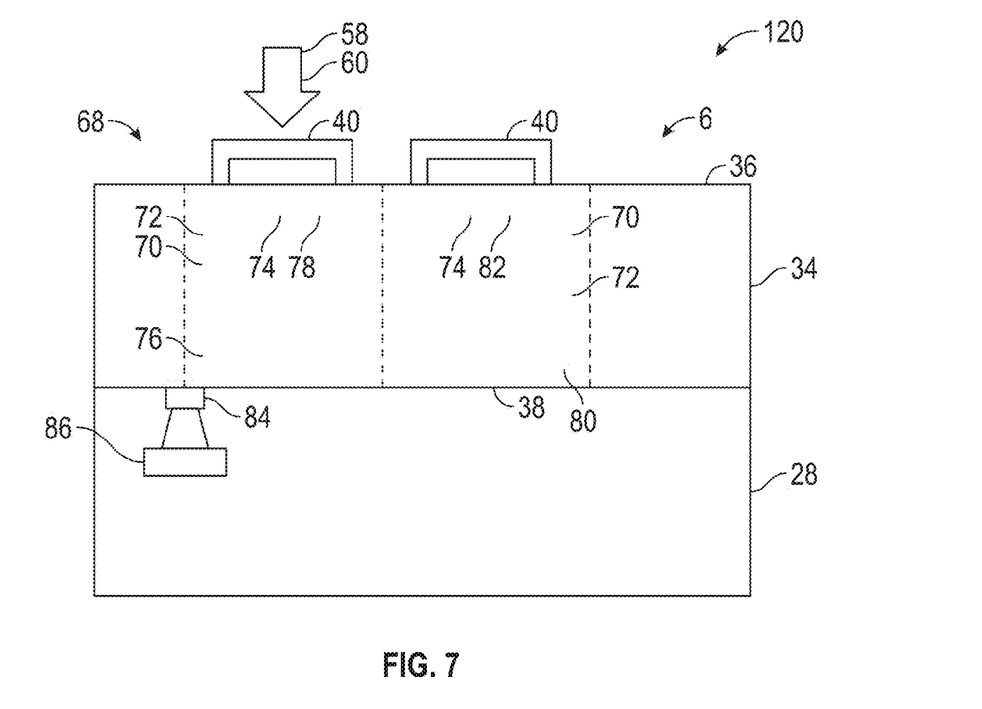
FIG. 7 is a cross section view of implementations of image sensors.

FIG. 7 shows an image sensor (sensor) 68 which includes a pair of photodiodes 70, each including a pixel 72 having a depletion region 74. First pixel 76 has a first depletion region (PD region) 78 and second pixel 80 has a second depletion region (PD region) 82. The light absorber layers are seen between the backside surface 36 and the ARC 40. A transfer gate 84 electrically couples the separated electrons with electrical routing 86 which is at least partially within the shown dielectric layer 28, which is a frontside dielectric layer. In this version there is no backside dielectric layer shown. The backside dielectric layer may be excluded, though in implementations there may be a backside dielectric layer which partially encapsulates the sides of the ARC 40 except at least for their top sides, as can be imagined. The electrical routing 86 may electrically couple the photodiode to another element of the image sensor such as an amplifier, a processor, a memory element, and so forth. The electrical routing may additionally or alternatively couple the photodiode with any element outside of (or external to) the image sensor, such as an amplifier, a processor, a memory element, and so forth.

Notably, the image sensor(s) of FIG. 7 do not include any lenses or light guides, but the light absorber layer is located directly on the semiconductor layer and the ARC 40 is located directly on top of the light absorber layer. Thus, this version does not include any focusing or light guiding elements. This architecture could be used in BSI image CCD and CMOS image sensors, and may not require focusing elements especially in longer than max c-Si detection wavelength (i.e., larger than approximately 1.2 microns).

Figure 8:
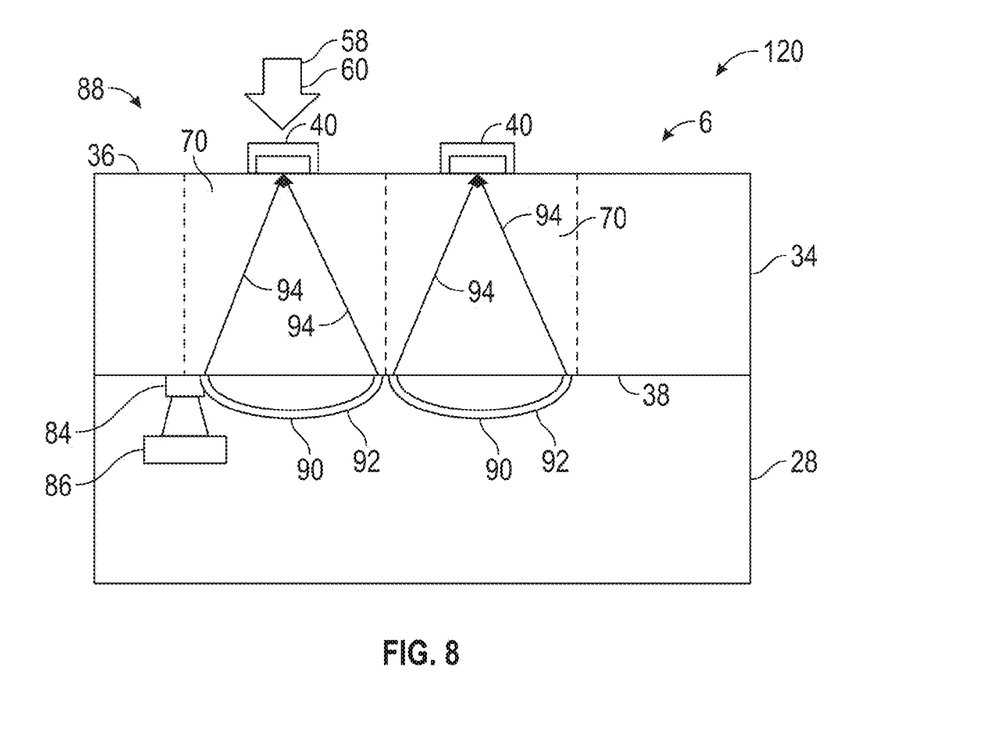
FIG. 8 is a cross section view of implementations of image sensors.

FIG. 8 shows an image sensor 88 that is identical to image sensor 68 except that a focusing element 90 is included within the frontside dielectric. Focusing element 90 is a reflector 92 and reflected light waves 94 of the incident light 58 are shown being directed towards the light absorber layer(s) thereby. Thus this image sensor includes a frontside reflecting focusing element which focuses the incident light towards a light absorber layer at the BSI side. In implementations the focusing element 90 is a metal reflector or a multilayer dielectric reflector.

Figure 9:
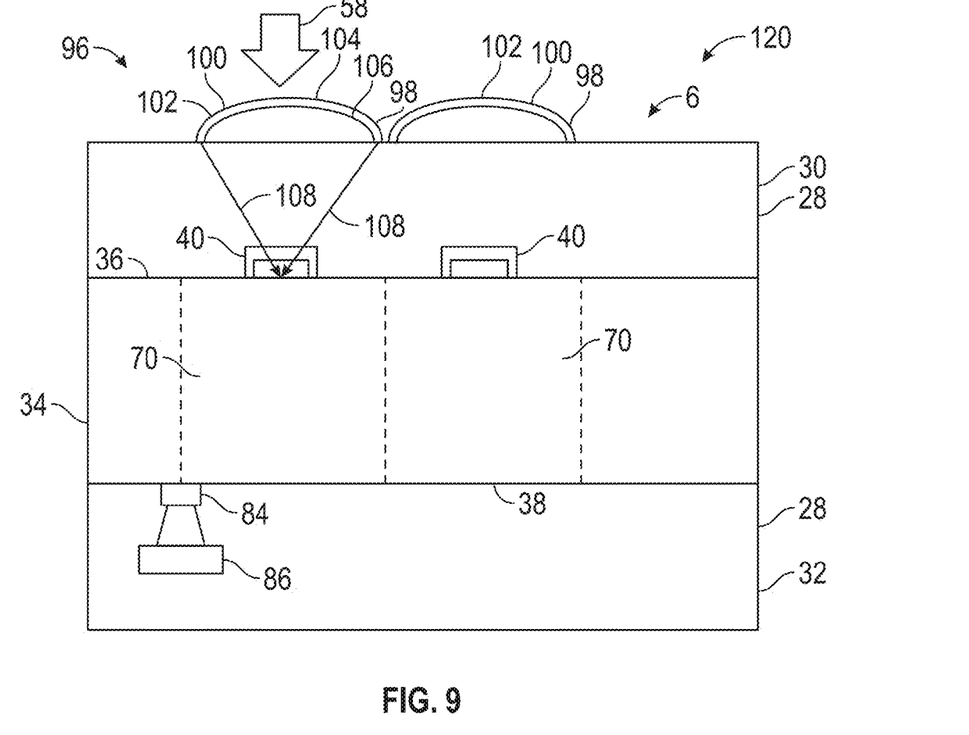
FIG. 9 is a cross section view of implementations of image sensors.

FIG. 9 shows an image sensor 96 which is similar to image sensor 68 except including a backside dielectric layer 30 and a focusing element 98, which is a lens 100. The lens 100 may be a microlens 102 which may simply be a bump 106 in the dielectric material and may have an antireflective coating 104 placed thereon. The bump may be formed of the same material as the backside dielectric layer and may have a refractive index greater than 1. In implementations the antireflective coating may be omitted. Refracted light 108 is shown being directed towards the light absorber material where it is absorbed.

Figure 10:
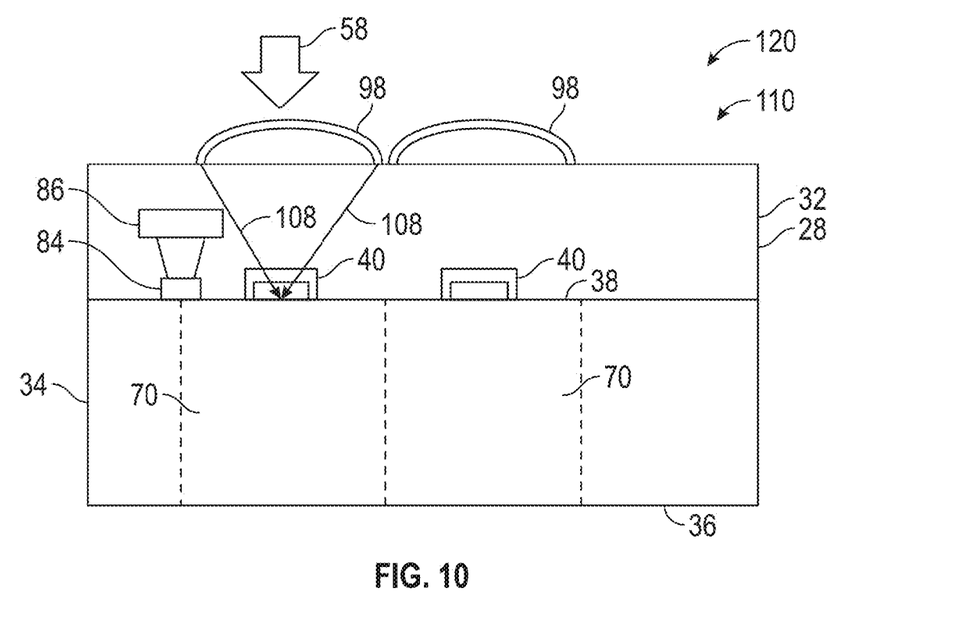
FIG. 10 is a cross section view of implementations of image sensors.

Image sensor 110 of FIG. 10 is identical to image sensor 96 except that it is a frontside device, with the light absorber material located at the frontside surface 38 of the semiconductor layer, and with the transfer gate 84 and electrical routing 86 located within the frontside dielectric layer 32. This image sensor may particularly be an option where larger pixels are used. In such implementations, the architecture may be designed so as to avoid illuminating metal routings with the incident light.

Some implementations of image sensors implemented using components disclosed herein may allow spectral collection in an extremely wide range (up to very long wavelengths in the far infrared (IR) range greater than 20 microns). For optimal conditions for any particular spectral range the choice of material for the light absorber layer and its thickness, as well as materials and sizes for the antireflective coatings, lenses, light guides, semiconductor layers, dielectric layers, and so forth, may be varied and or developed, and related changes in process flows may be undertaken as well.

In some implementations of image sensors some photons may be released from the light absorber layer from the light absorber layer itself being heated, but the amount of photons may be small or negligible relative to the incident light.

In places where the description above refers to particular implementations of image sensors and related methods and implementing components, sub-components, methods and sub-methods, it should be readily apparent that a number of modifications may be made without departing from the spirit thereof and that these implementations, implementing components, sub-components, methods and sub-methods may be applied to other image sensors and related methods.

What is claimed is:

1. An image sensor, comprising:
a semiconductor layer, and;
a light absorber layer coupled with the semiconductor layer at a pixel region of the image sensor, the light absorber layer configured to absorb incident light and to substantially prevent the incident light from entering the semiconductor layer;
wherein the light absorber layer is configured to heat a region of the semiconductor layer adjacent to the light absorber layer in response to absorbing the incident light and to create electron/hole pairs therein; and
wherein the light absorber layer is positioned between two deep trenches of the semiconductor layer, each deep trench extending fully through the semiconductor layer from a backside of the semiconductor layer through to a frontside of the semiconductor layer.

2. The image sensor of claim 1, wherein the light absorber layer comprises a material selected from the group consisting of: Co; $CoSi_2$; Mo; $MoSi_2$; Ni; NiSi; $Ni_2Si$; $NiSi_2$; Pd; PdSi; $Pd_2Si$; Pt; PtSi; Ta; $TaSi_2$; Ti; $TiSi_2$; W; WSi; $WSi_2$; Zr; $ZrSi_2$; polycrystalline Si; Ge doped monocrystalline Si; Ge film on Ge doped silicon; GeSe film on Silicon; and any combination thereof.

3. The image sensor of claim 1, further comprising a microlens, the light absorber layer coupled between the microlens and the semiconductor layer, the microlens configured to refract the incident light towards the light absorber layer.

4. The image sensor of claim 1, further comprising an antireflective coating (ARC) coupled between the incident light and the light absorber layer.

5. The image sensor of claim 1, wherein the image sensor comprises a quantum efficiency (QE) above 50% for photons within a wavelength range of 0.7 to 20 microns.

6. An image sensor, comprising:
a photodiode comprised at least partially within a semiconductor layer, and;
a light absorber layer coupled with the photodiode, the light absorber layer configured to absorb incident light within predetermined wavelengths to substantially prevent the incident light from passing from the light absorber layer to the photodiode;
wherein the light absorber layer is configured to heat a depletion region of the photodiode in response to absorbing the incident light and to create electron/hole pairs in the depletion region thereby, and;
wherein the image sensor further comprises at least one dielectric layer coupled with the semiconductor layer, and electrical routing coupled at least partially within the at least one dielectric layer which electrically couples the photodiode with at least one other element of the image sensor.

7. The image sensor of claim 6, further comprising an antireflective coating (ARC) coupled between the incident light and the light absorber layer.

8. The image sensor of claim 6, wherein the light absorber layer is comprised at a backside of the semiconductor layer and wherein the at least one dielectric layer comprises a frontside dielectric layer coupled at a frontside of the semiconductor layer opposite the backside of the semiconductor layer.

9. The image sensor of claim 6, wherein the light absorber layer is comprised at a backside of the semiconductor layer, a focusing element is comprised proximate a frontside of the semiconductor layer opposite the backside of the semiconductor layer, and wherein the focusing element is configured to focus the incident light which has already passed through the semiconductor layer back through the semiconductor layer towards the backside of the semiconductor layer.

10. The image sensor of claim 6, wherein the light absorber layer comprises a material selected from the group consisting of: Co; $CoSi_2$; Mo; $MoSi_2$; Ni; NiSi; $Ni_2Si$; $NiSi_2$; Pd; PdSi; $Pd_2Si$; Pt; PtSi; Ta; $TaSi_2$; Ti; $TiSi_2$; W; WSi; $WSi_2$; Zr; $ZrSi_2$; polycrystalline Si; Ge doped monocrystalline Si; Ge film on Ge doped silicon; GeSe film on Silicon; and any combination thereof.

11. The image sensor of claim 6, wherein the light absorber layer is positioned between two trenches in the semiconductor layer, each trench extending at least partially through the semiconductor layer.

12. The image sensor of claim 6, wherein the image sensor comprises a quantum efficiency (QE) above 50% for photons within a wavelength range of 0.7 to 20 microns.

13. An image sensor, comprising:
   a complementary metal-oxide-semiconductor (CMOS) device comprising a semiconductor layer, the semiconductor layer comprising a plurality of photodiodes, each photodiode comprising a pixel having a depletion region, and;
   a plurality of light absorber layers, each light absorber layer coupled with one of the pixels of the semiconductor layer, each light absorber layer configured to absorb incident light and substantially prevent the incident light from entering one of the photodiodes;
   wherein each light absorber layer is configured to heat the depletion region of one of the photodiodes in response to absorbing the incident light, and to create electron/hole pairs in the depletion region thereby, through an increase in temperature alone.

14. The image sensor of claim 13, wherein the image sensor comprises a quantum efficiency (QE) above 50% for photons within a wavelength range of 0.7 to 20 microns.

\* \* \* \* \*